(12) United States Patent
Choi et al.

(10) Patent No.: US 7,961,539 B2
(45) Date of Patent: Jun. 14, 2011

(54) METHOD OF OPERATING SEMICONDUCTOR DEVICE

(75) Inventors: Sang-moo Choi, Yongin-si (KR); Won-joo Kim, Hwaseong-si (KR); Tae-hee Lee, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 23 days.

(21) Appl. No.: 12/591,202

(22) Filed: Nov. 12, 2009

(65) Prior Publication Data

US 2010/0127759 A1 May 27, 2010

(30) Foreign Application Priority Data

Nov. 25, 2008 (KR) .................. 10-2008-0117475

(51) Int. Cl.
*G11C 13/00* (2006.01)
(52) U.S. Cl. ............ 365/218; 365/185.18; 365/185.19; 365/185.26; 365/185.29

(58) Field of Classification Search .................. 365/218, 365/185.18, 185.19, 185.26, 185.29
See application file for complete search history.

(56) References Cited

U.S. PATENT DOCUMENTS

| 6,088,266 | A  | * | 7/2000  | Roohparvar | 365/185.19 |
|-----------|----|---|---------|------------|------------|
| 7,035,147 | B2 | * | 4/2006  | Yeh et al. | 365/185.29 |
| 7,123,509 | B2 |   | 10/2006 | Ohsawa     |            |
| 7,512,008 | B2 | * | 3/2009  | Chan et al.| 365/185.19 |
| 7,733,700 | B2 | * | 6/2010  | Wang       | 365/185.18 |
| 2007/0187775 | A1 | | 8/2007 | Okhonin et al. |       |

FOREIGN PATENT DOCUMENTS

KR     10-0800156     1/2008
* cited by examiner

*Primary Examiner* — Connie C Yoha
(74) *Attorney, Agent, or Firm* — Harness, Dickey & Pierce, P.L.C.

(57) ABSTRACT

Provided is a method of operating a semiconductor device, in which a gate voltage or a drain voltage is adjusted in order to add carriers to or remove carriers from a body region, thereby realizing semiconductor having a plurality of data states.

20 Claims, 8 Drawing Sheets

METHOD OF OPERATING SEMICONDUCTOR DEVICE

PRIORITY STATEMENT

This application claims priority under 35 U.S.C. §119 to Korean Patent Application No. 10-2008-0117475, filed on Nov. 25, 2008, in the Korean Intellectual Property Office (KIPO), the entire contents of which is incorporated herein by reference.

BACKGROUND

1. Field

Example embodiments relate to a method of operating a semiconductor device, and more particularly, to a method of operating a semiconductor device having a plurality of data states by adding carriers to a body region or removing carriers from the body region.

A conventional memory, for example, a DRAM, may include one transistor and one capacitor as a memory cell. However, there are limitations to the scalability of the conventional memory, due to the capacitor, in particular, the size of the capacitor. As a result, a memory including one transistor (1T) and no capacitor as a memory cell, referred to as "a capacitor-less memory or 1-T DRAM", has been studied. The 1-T DRAM may be not only simple to manufacture but also easy to make a memory device with larger density.

2. Description of the Related Art

Examples of a 1-transistor (T) dynamic random access memory (DRAM) are described in Korean Patent Application Nos. 2007-0072962 filed on Jul. 20, 2007, 2007-0073519, filed on Jul. 23, 2007, 2007-0080152, filed on Aug. 9, 2007, and 2007-0090185, filed on Sep. 5, 2007 in the Korean Intellectual Property Office (KIPO).

SUMMARY

The inventive concept provides a method of operating a semiconductor device having a plurality of data states by adding carriers to a body region or removing carriers from the body region.

According to an aspect of the inventive concept, there is provided a method of operating at least one semiconductor device including a drain region, a source region, a floating body region, and a gate region, the method including a first operation in which carriers are generated and stored in the floating body region by using a first gate voltage pulse signal supplied to the gate region, a first drain voltage pulse signal supplied to the drain region, and a first source voltage pulse signal supplied to the source region; and a second operation in which a second gate voltage pulse signal is supplied to the gate region, where the second gate voltage pulse signal corresponds to an amount of carriers to be removed from the floating body region, wherein the semiconductor device may include a data state according to an amount of carriers remaining in the floating body region from among n data states, where n is a natural number equal to or greater than 3.

In the second operation, the amount of the carriers removed from the floating body region may be controlled by adjusting the enabled voltage of the second gate voltage pulse signal.

In the second operation, the enabled voltage of the second gate voltage pulse signal may have a negative value, and a standby voltage of the second gate voltage pulse signal may be lower than the enabled voltage of the second gate voltage pulse signal, the lower the enable voltage of the second gate voltage pulse signal, the less the amount of holes may be removed from the floating body region.

After performing the second operation, the method may further include a third operation in which an enabled voltage of a third gate voltage pulse signal supplied to the gate region and an enabled voltage of a third drain voltage pulse signal supplied to the drain region are adjusted to increase the amount of the carriers stored in the floating body region.

BRIEF DESCRIPTION OF THE DRAWINGS

Example embodiments will be more clearly understood from the following brief description taken in conjunction with the accompanying drawings.

FIG. 1 is a cross-sectioned view of a 1-transistor (T) dynamic random access memory (DRAM) that operates using a method of operating a semiconductor device according to an example embodiment;

FIG. 2 is a circuit diagram of the 1-T DRAM of FIG. 1;

FIG. 3 is a cross-sectioned view for explaining a process in which a plurality of carriers are generated in the 1-T DRAM of FIG. 1 in a WRITE mode according to an example embodiment;

FIG. 4 is a cross-sectioned view for explaining a state in which the carriers are stored after the WRITE mode of FIG. 3 is performed;

FIG. 5 is a cross-sectioned view for explaining a state in which carriers are not stored;

FIG. 6 is a graph illustrating a sensing margin of the 1-T DRAM of FIG. 1;

FIG. 7 illustrates voltage pulse signals supplied in an example embodiment of a method of operating a semiconductor device;

FIGS. 8 to 10 illustrate density distributions of carriers in an ERASE mode of FIG. 7;

FIG. 11 is a graph illustrating a variation in current that flows between drain and source regions according to gate voltage;

FIG. 12 illustrates voltage pulse signals supplied in an example embodiment of a method of operating a semiconductor device;

FIG. 13 is a cross-sectioned view of a 1-T DRAM that operates using a method of operating a semiconductor device according to an example embodiment of the inventive concept; and FIG. 14 is a cross-sectioned view of a 1-T DRAM that operates using a method of operating a semiconductor device according to an example embodiment.

Figure 1:
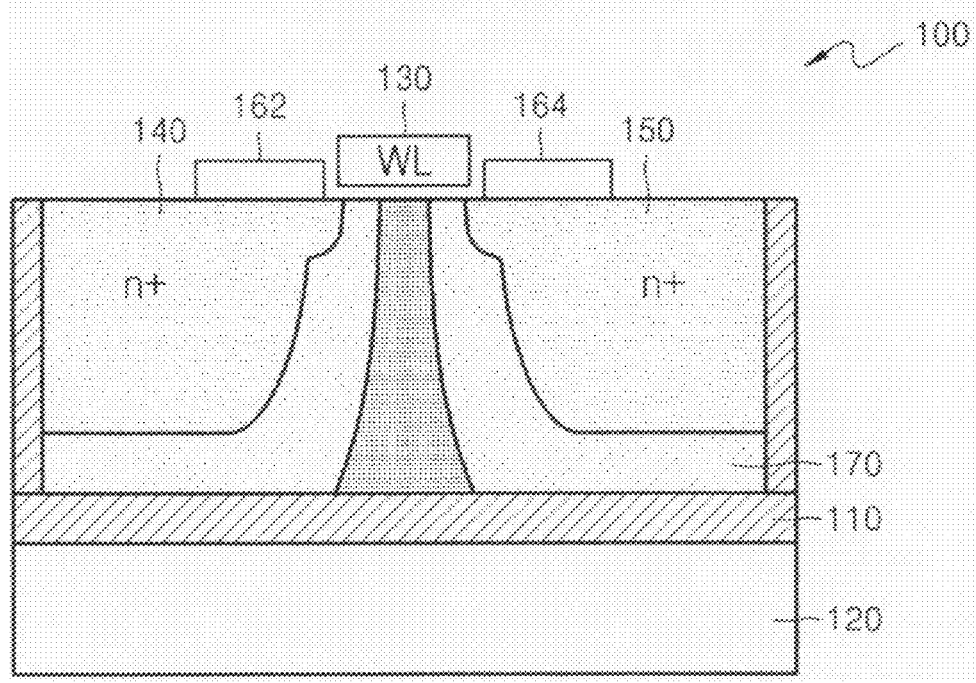
FIGS. 1-14 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
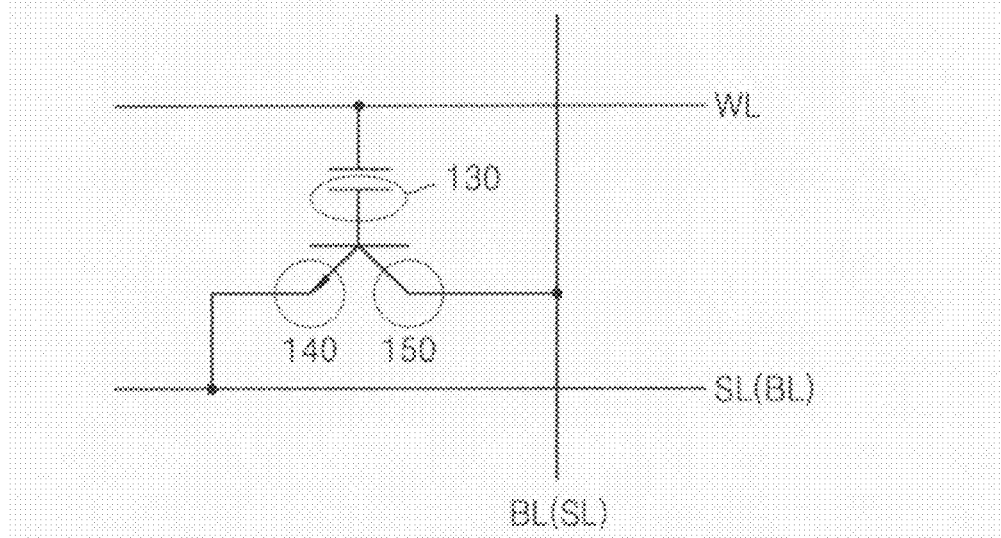

FIG. 1 is a cross-sectional diagram of an example memory cell of 1-transistor dynamic random access memory (1T-DRAM) device according to example embodiments. Referring to FIG. 1, a memory cell 100 of 1T-DRAM may include an insulating layer 110 on a semiconductor substrate 120, a body region 170, a gate electrode 130, a source electrode 162, a drain electrode 164, a source region 140, and a drain region 150. The source region 140 and the drain region 150 may be doped with impurities. According to example embodiments, the source region 140 and the drain region 150 may be interchanged with each other, and therefore the source electrode 162 and the drain electrode 164 may be interchanged with each other. For example, the semiconductor device of FIG. 1 may be bi-directional. A gate voltage, a drain voltage, and a source voltage, which are applied to the gate electrode 130, the source electrode 162, and the drain electrode 164, respectively, may be adjusted so that data can be written, erased, and/or read in the memory cell 100 of 1T-DRAM device FIG. 2 is a circuit diagram of the example memory cell 100 of 1T-DRAM device of FIG. 1 connected to a source line SL, a bit line BL and a word line WL. Referring to FIGS. 1 and 2, the source region 140 may be connected to the source line SL through the source electrode 162 and the drain region 150 may be connected to the bit line BL through the drain electrode 164. The source voltage may be supplied to the source region 140 through the source line SL and the drain voltage may be supplied to the drain region 150 through the bit line BL. Also, the gate electrode 130 may be connected to a word line WL and the gate voltage may be supplied to the gate electrode 130 through the word line WL.

Figure 3:
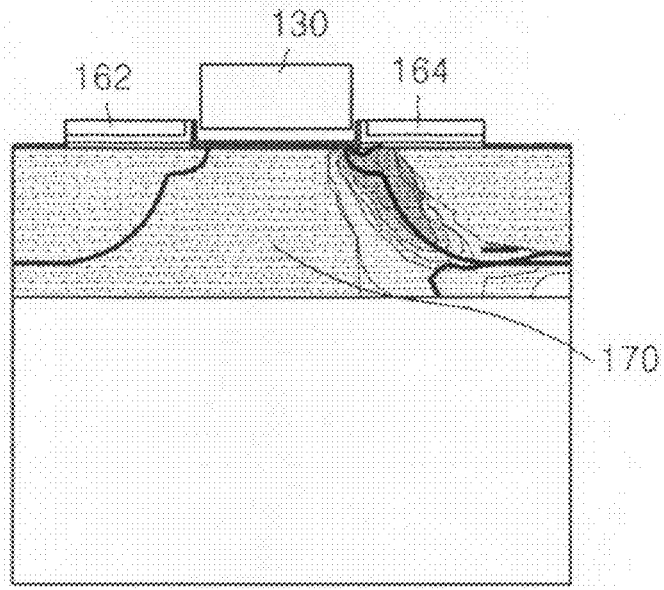
Figure 4:
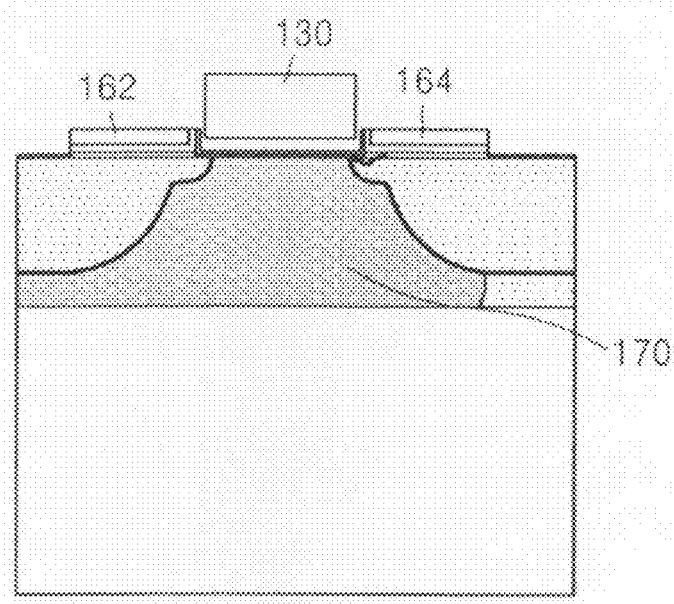
Figure 5:
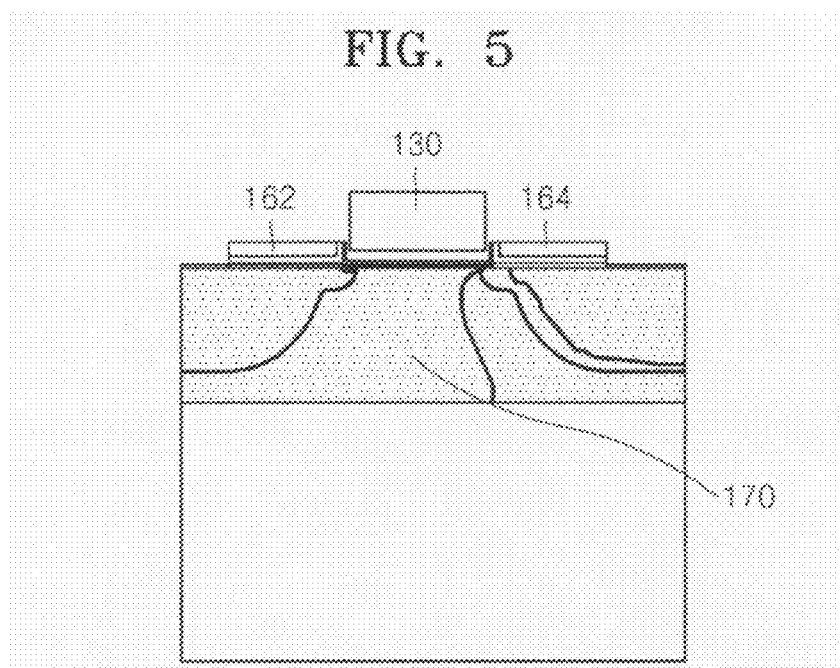

FIG. 3 is a cross-sectional view illustrating carrier generation in a write mode of the memory cell of the 1T-DRAM device of FIG. 1. FIG. 4 is a cross-sectional view illustrating carrier storage after the write mode of the memory cell of the 1T-DRAM device of FIG. 3. FIG. 5 is a cross-sectional view illustrating the absence of carrier storage in the 1T-DRAM device of FIG. 1.

In a WRITE mode, a plurality of electron-hole pairs may be generated under given voltage bias condition by impact ionization or avalanche breakdown in a portion of the memory cell where the body region 170 and the drain region 150 contact each other, illustrated in FIG. 3. The generated electrons are moved into the drain region 150 and the generated holes, majority carries, are moved into the body region 170 under the given voltage bias condition. In a HOLD mode, the generated majority carriers, holes, are stored in the body region 170 as illustrated in FIG. 4. In contrast, if carriers are not generated in the WRITE mode or removed in an erased mode, no carriers are stored in the body region 170 as illustrated in FIG. 5.

If carriers are stored in the body region 170, data '1' may be considered written to the memory cell of 1-T DRAM. If carriers are not stored in the body region 170, data '0' may be considered written to the memory cell of 1-T DRAM.

In the ERASE mode, carriers may be removed from the body region 170. After the ERASE mode is completed, the body region 170 is as illustrated in FIG. 5.

In a read mode, data may be read from the memory cell 100 of 1T-DRAM device by measuring the amount of current that flows between the drain region 150 and the source region 140 when a gate read voltage is applied to the gate electrode 130. When carriers are stored in the body region 170, the amount of current that flows between the drain region 150 and the source region 140 may be high and/or increased. When carriers are not stored in the body region 170, the amount of current that flows between the drain region 150 and the source region 140 may be small and/or decreased.

Figure 6:
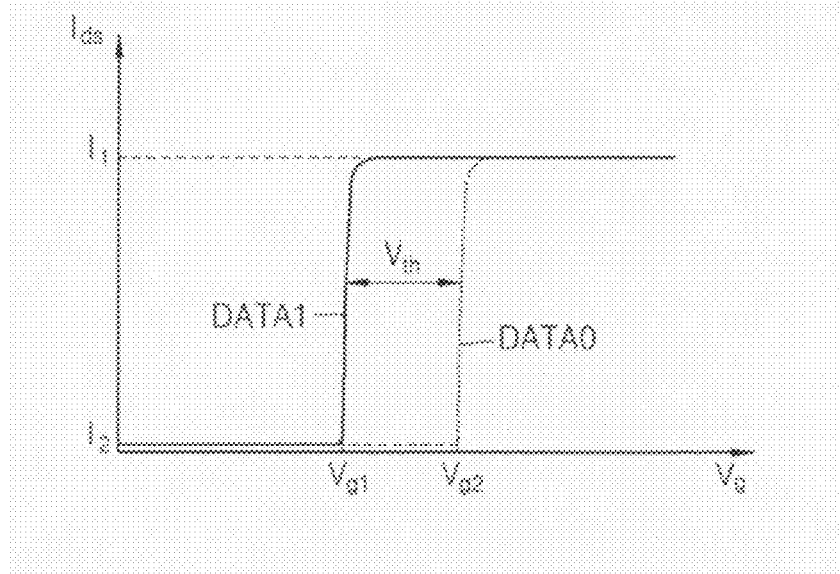

FIG. 6 is a graph of drain/source current ($I_{ds}$) as a function of gate voltage ($V_g$), illustrating a sense margin of the memory cell of 1T-DRAM device of FIG. 1. Referring to FIG. 6, when the memory cell 100 of 1T-DRAM device has a data value of "1" (e.g., when carriers are stored in the body region 170), a sense current may correspond to DATA1 curve. When the 1T-DRAM device 100 has a data value of "0" (e.g., when carriers are not stored in the body region 170), a sense current may be illustrated by DATA0 curve. If the data value of the memory cell 100 of 1T-DRAM device is "1" and a read voltage between a first gate voltage $V_{g1}$ and a second gate voltage $V_{g2}$ is applied to the gate electrode 130, a large and/or increased current $I_1$ may flow between the source region 140 and the drain region 150. If the data value of the 1T-DRAM device 100 is "0" and the read voltage between a first gate voltage $V_{g1}$ and a second gate voltage $V_{g2}$ is applied to the gate electrode 130, a small and/or decreased current $I_2$ may flow between the source region 140 and the drain region 150. The data value stored in the memory cell of 1T-DRAM device may be determined by sensing whether the sense current is $I_1$ (e.g., data value "1") or $I_2$ (e.g., data value "0"). A difference between the first gate voltage $V_{g1}$ and the second gate voltage $V_{g2}$ is referred to as a sense margin, denoted by $\Delta V$th in FIG. 6. The sense margin refers to the difference between the threshold voltage of the memory cell of 1T-DRAM device when carriers are stored and when carriers are not stored.

Thus far the 1-T DRAM semiconductor device has been described as having two data states, but when applying the method of operating a semiconductor device to a semiconductor device according to the example embodiment may be applied to a semiconductor device having three or more data states. The three or more data states may be differentiated from one another by checking the amount of carriers stored in a body region of the semiconductor device. In order for the semiconductor device to have the three or more data states, carriers are generated and stored in the body region in the WRITE mode, and the amount of the carriers stored is reduced by removing an amount of the carriers from the body region in the ERASE mode. For example, if it is assumed that the semiconductor device has four data states, a first data state in which carriers are stored in the body region may correspond to data '11', a second data state in which an amount of the carriers is removed from the body region may correspond to data '10', a third data state in which a certain amount of the carriers is further removed may correspond to data '01', and a fourth data state in which a certain amount of the carriers is further removed may correspond to data '00'.

Figure 7:
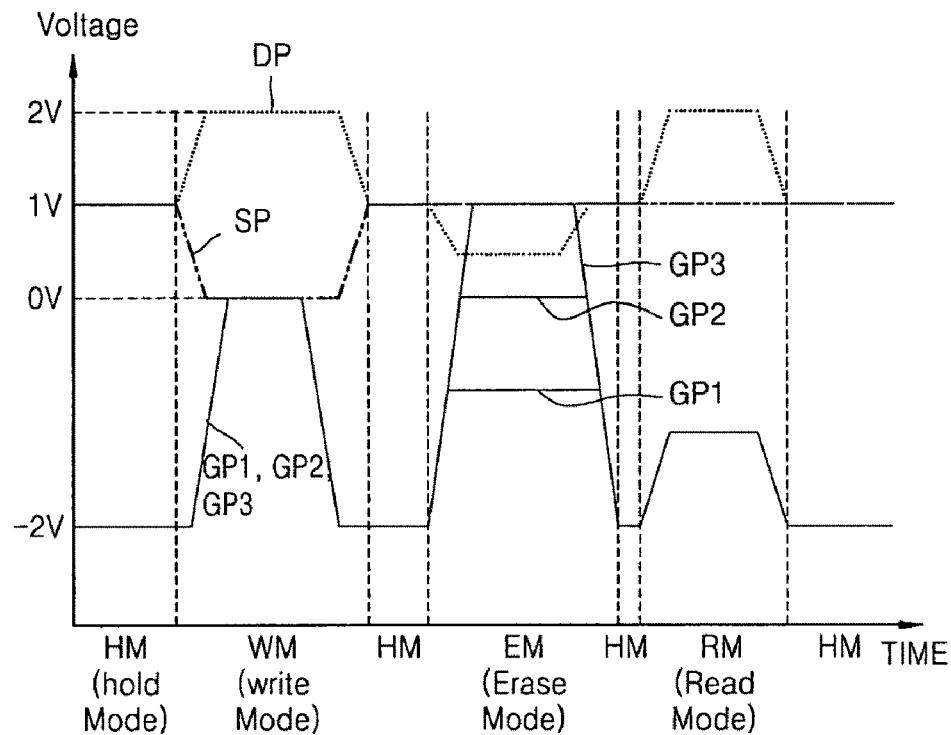

FIG. 7 illustrates voltage pulse signals supplied in an embodiment of a method of operating a semiconductor device. In the method of FIG. 7, a first operation (WRITE mode WM) and a second operation (ERASE mode EM) are sequentially performed. Carriers are generated in the Write mode WM and are removed in the ERASE mode EM.

Referring to FIGS. 1 and 7, a drain voltage pulse signal DP and a source voltage signal SP are supplied to the drain region 150 and the source region 140, and one of first to third gate voltage pulse signals GP1, GP2, and GP3 is supplied to the gate electrode 130. The difference between the voltages of the drain voltage pulse signal DP and the source voltage signal SP supplied in the ERASE mode EM may be less than in the WRITE mode WM. The more the difference between the voltages of the drain voltage pulse signal DP and the source voltage signal SP is, the more carriers are generated in the body region 170. Thus, since the carriers may not need to be generated in the body region 170 in the ERASE mode EM, the difference between the voltages of the drain voltage pulse signal DP and the source voltage signal SP supplied in the ERASE mode EM may be less than in the WRITE mode WM. The drain voltage pulse signal DP and the source voltage signal SP supplied in the ERASE mode EM may be negative or positive. Referring to FIG. 7, the voltages of the drain voltage pulse signal DP and the source voltage signal SP may be higher than the gate voltages GP1, GP2, and GP3 in a standby state. Hereinafter, the enable voltage may be the enable-state voltage level and the standby voltage may be the standby-state voltage level. The enable state may be the state of a pulse which may be a positive pulse or a negative pulse. The standby state may be the state that is not a pulse state. The standby voltage may be the hold voltage.

In the ERASE mode EM, the voltages of the first through third gate voltage pulse signals GP1, GP2, and GP3 may be adjusted based on data to be written. In the ERASE mode EM, the first gate voltage pulse signal GP1 has the lowest voltage and the third gate voltage pulse signal GP3 has the highest voltage from among the first to third gate voltage pulse signals GP1, GP2, and GP3. The amount of carriers to be removed from the body region 170 may be controlled by adjusting the first to third gate voltage pulse signals GP1, GP2, and GP3 in the ERASE mode EM. When the carriers are holes, a small amount of the holes is removed in the ERASE mode EM when the first gate voltage pulse signal GP1 having the lowest voltage in the ERASE mode EM is supplied and a large amount of the holes is removed in the ERASE mode EM when the third gate voltage pulse signal GP3 having the highest voltage in the ERASE mode EM is supplied. The higher the gate voltage is, the more the carriers are removed from the body region 170 since the more negative gate voltage hold the more carriers in the body region 170.

According to an example embodiment, the semiconductor device has a data state corresponding to the amount of carriers remaining in the body region 170 from among three or more data states. For example, the amount of the carriers to be removed from the body region 170 is changed by changing the voltages of the first to third gate voltage pulse signals GP1, GP2, and GP3 in the ERASE mode EM, and different data states may be expressed according to the amount of the carriers remaining in the body region 170.

For example, assuming the semiconductor device has four data states, a first data state in which carriers are stored in the body region 170 may correspond to data '11'. A second data state in which an amount of the carriers is removed from the body region 170 by supplying the first gate voltage pulse signal GP1 may correspond to data '10'. A third data state in which an amount of the carriers is further removed by supplying the second gate voltage pulse signal GP2 may correspond to data '01'. A fourth data state in which an amount of the carriers is further removed by supplying the third gate voltage pulse signal GP3 may correspond to data '00'.

Data '11' written to the memory cell of semiconductor device may be changed to data '00' by supplying the third gate voltage pulse signal GP3 in the first data state in which the carriers are stored in the body region 170. Also, data '10' written to the semiconductor device may be changed to data '01' by supplying the second gate voltage pulse signal GP2.

Referring to FIG. 7, in the WRITE mode WM, the first to third gate voltage pulse signals GP1 to GP3 are switched from an enable voltage to the standby voltage, and then, the drain voltage pulse signal DP is switched from the enable voltage to the standby voltage. In the WRITE mode WM, the first to third gate voltage pulse signal GP1 to GP3, and the drain voltage pulse signal DP may also be switched from the enable voltage to the standby voltage at the same time.

In the ERASE mode EM, the drain voltage pulse signal DP is switched from the enable voltage to the standby voltage, and then, the first to third gate voltage pulse signals GP1 to GP3 are switched from an enable voltage to the standby voltage.

The source voltage signal SP supplied to the source region 140 may be a pulse signal in the WRITE mode WM and may have a constant voltage in the ERASE mode EM.

FIG. 7 also illustrates voltage pulse signals supplied in a READ mode RM performed after the WRITE mode WM, and the ERASE mode EM are sequentially performed. In the READ mode RM, a gate voltage and the amount of current that flows between the drain and source regions 150 and 140 are measured after the WRITE mode WM and the ERASE mode EM are performed in order to determine the data state of the memory cell of the semiconductor device based on the amount of the carriers remaining in the body region 170.

Although FIG. 7 illustrates that the WRITE mode WM, the ERASE mode EM, and the READ mode RM are sequentially performed, the inventive concept is not limited thereto and these modes may be performed in another order. Also, any one of these modes may not be performed. For example, the READ mode RM may not be performed and only the WRITE mode WM and the ERASE mode EM may be performed.

Figure 8:
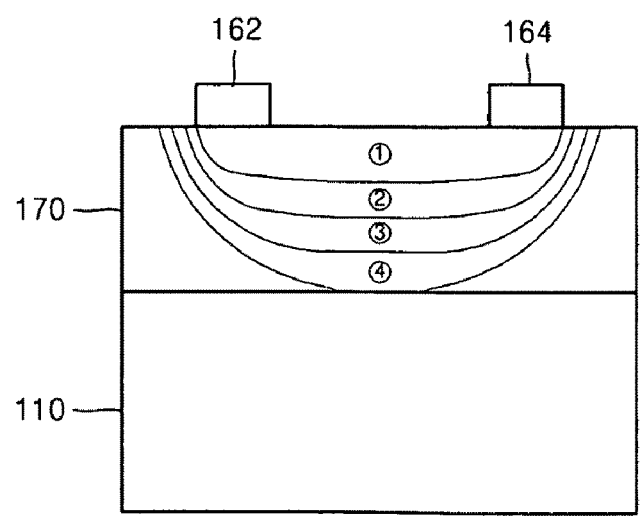
Figure 9:
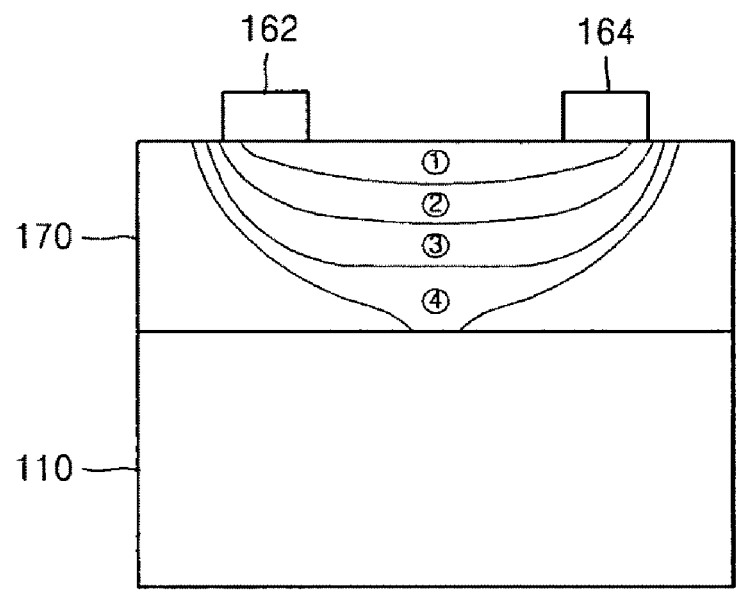
Figure 10:
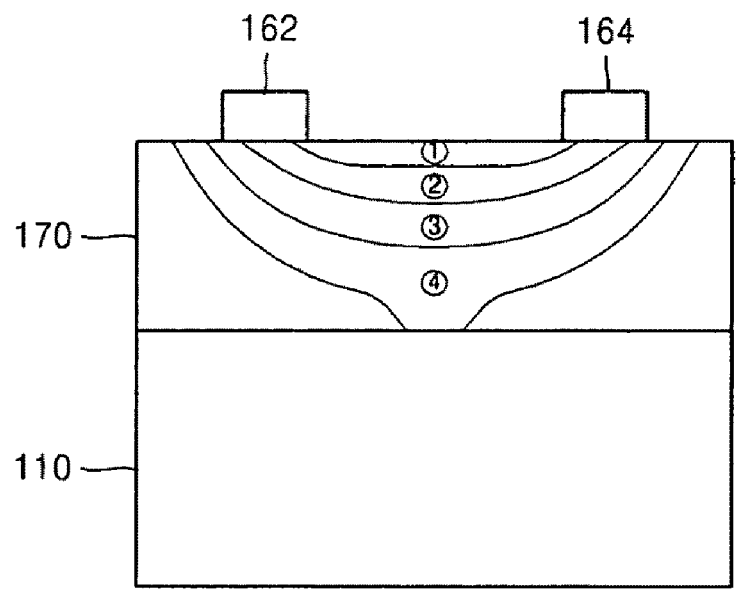

FIGS. 8 to 10 illustrate a carrier concentration distribution in a body region 170 in the ERASE mode of FIG. 7. FIG. 8 illustrates a case where the first gate voltage pulse signal GP1 of FIG. 7 is supplied to the gate electrode. FIG. 9 illustrates a case where the second gate voltage pulse signal GP2 of FIG. 7 is supplied to the gate electrode. FIG. 10 illustrates a case where the third gate voltage pulse signal GP3 of FIG. 7 is supplied to the gate electrode. Referring to FIGS. 8 to 10, parts of the body region 170 are indicated with reference numerals 1 to 4, wherein the higher the number of the body region 170, the lower the density of carriers.

Area 1, which has the highest density of carriers, in FIG. 8 is greater than in FIG. 9. For example, the amount of the carriers remaining in the body region 170 when the first gate voltage pulse signal GP1 is supplied (FIG. 8) is greater than when the second gate voltage pulse signal GP2 is supplied (FIG. 9). This is because the amount of the carriers removed from the body region 170 when the first gate voltage pulse signal GP1 is supplied (FIG. 8) is less than when the second gate voltage pulse signal GP2 is supplied (FIG. 9).

Also, Area 1 in FIG. 9 is greater than in FIG. 10. That is, the amount of the carriers remaining in the body region 170 when the second gate voltage pulse signal GP2 is supplied (FIG. 9) is greater than when the third gate voltage pulse signal GP3 is supplied (FIG. 10). This is because the amount of the carriers removed from the body region 170 when the second gate voltage pulse signal GP2 is supplied (FIG. 9) is less than when the third gate voltage pulse signal GP3 is supplied (FIG. 10).

As described above, in a method of operating a semiconductor device according to an example embodiment, the amount of carriers, e.g., holes, to be removed from a body region may be changed by adjusting a gate voltage in an ERASE mode, and three or more data states may be expressed according to the amount of the carriers remaining in the body region.

Figure 11:
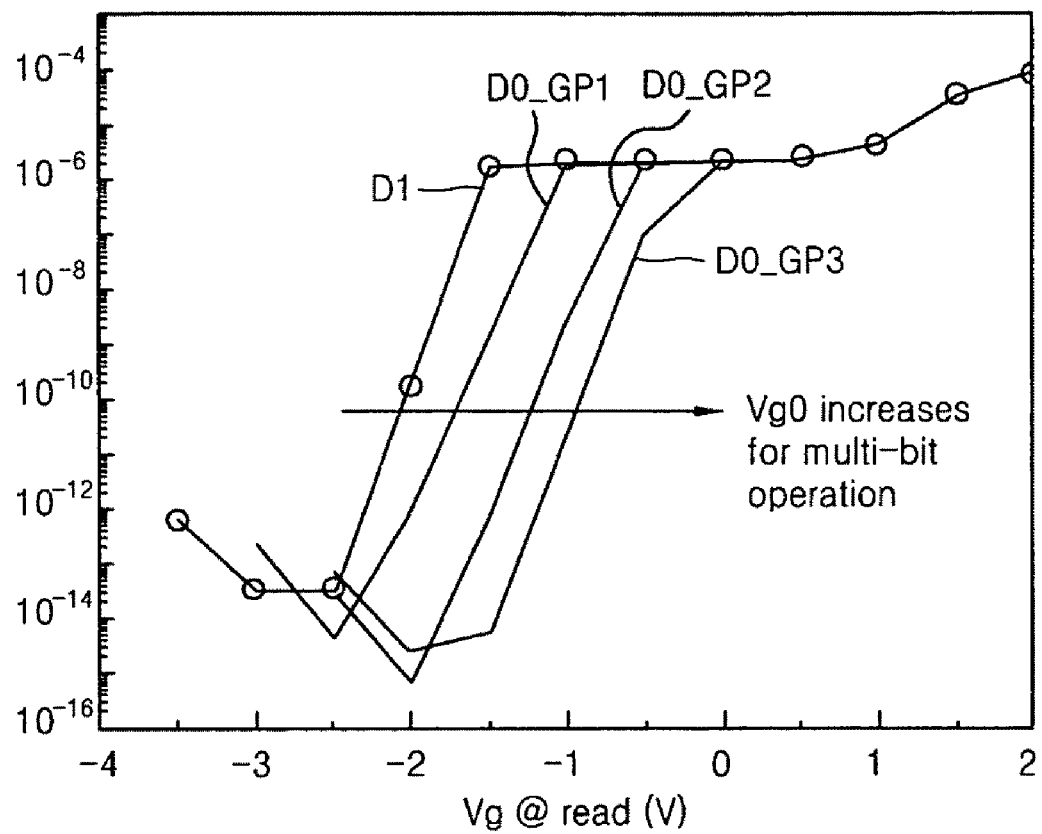

FIG. 11 is a graph of drain/source current ($I_{ds}$) as a function of gate voltage ($V_g$) a read operation illustrating a variation in current that flows between drain and source regions according to an embodiment of a method of operating a semiconductor device. Referring to FIG. 11, a plot D1 indicates the relationship between gate voltage and drain/source current ($I_{ds}$) that flows between the drain and source regions (hereinafter, referred to as 'sensing current') after carriers are generated in a WRITE mode. The other plots D0_GP1, D0_GP2, and D0_GP3 indicate the relationships between gate voltage and drain/source current ($I_{ds}$) when certain amounts of the carriers are removed by supplying the first to third gate voltage pulse signals GP1 to GP3, respectively.

Referring to FIG. 11, the plot D0_GP2, illustrating a case where the second gate voltage pulse signal GP2 is supplied to the memory cell, is located to the right side of the graph D0_GP1, illustrating a case where the first gate voltage pulse signal GP1 is supplied to the memory cell. This means that the amount of the carriers removed when the second gate voltage pulse signal GP2 is supplied is greater than when the first gate voltage pulse signal GP1 is supplied to the memory cell. Also, the plot D0_GP3, illustrating a case where the third gate voltage pulse signal GP3 is supplied to the memory cell, is located to the right side of the graph D0_GP2. This means that the amount of the carriers removed when the third gate voltage pulse signal GP3 is supplied is greater than when the second gate voltage pulse signal GP2 is supplied.

For example, the plots D1, D0_GP1, D0_GP2, and D0_GP3 may correspond to data '11', '10', '01' and '00' written to a memory cell of a semiconductor device as described above with reference to FIG. 7. If data written to memory cell of the semiconductor device is '11', that is, if carriers are stored in the body region 170 of FIG. 7 according to a gate voltage applied to the gate electrode 130 of FIG, then drain/source current ($I_{ds}$) of the read operation is illustrated as the graph D1. As the amount of the carriers removed from the body region 170 increases, the graph D1 changes in the order of the plots D0_GP1, the plot D0_GP2, and then the plot D0_GP3.

If a voltage between the threshold voltages on the graphs D1 and D0_GP1 is applied to the gate electrode 130 during the read mode, a large amount of current flows between the drain region 150 and the source region 140 when data '11' is written to the memory cell of the semiconductor device and a small amount of current flows between the drain region 150 and the source region 140 when data '10' is written to the memory cell of the semiconductor device. Thus, it is possible to determine whether data '11' or '10' is written to memory cell of the semiconductor device. Likewise, it is possible to determine whether data '10' or '01' is written to the memory cell of the semiconductor device by applying a voltage between the threshold voltages on the graphs D0_GP1 and D0_GP2 to the gate electrode 130 during the read mode. Also, it is possible to determine whether data '01' or '00' is written to the semiconductor device by applying a voltage between the threshold voltages on the graphs D0_GP2 and D0_GP3 to the gate electrode 130 during the read mode.

Figure 12:
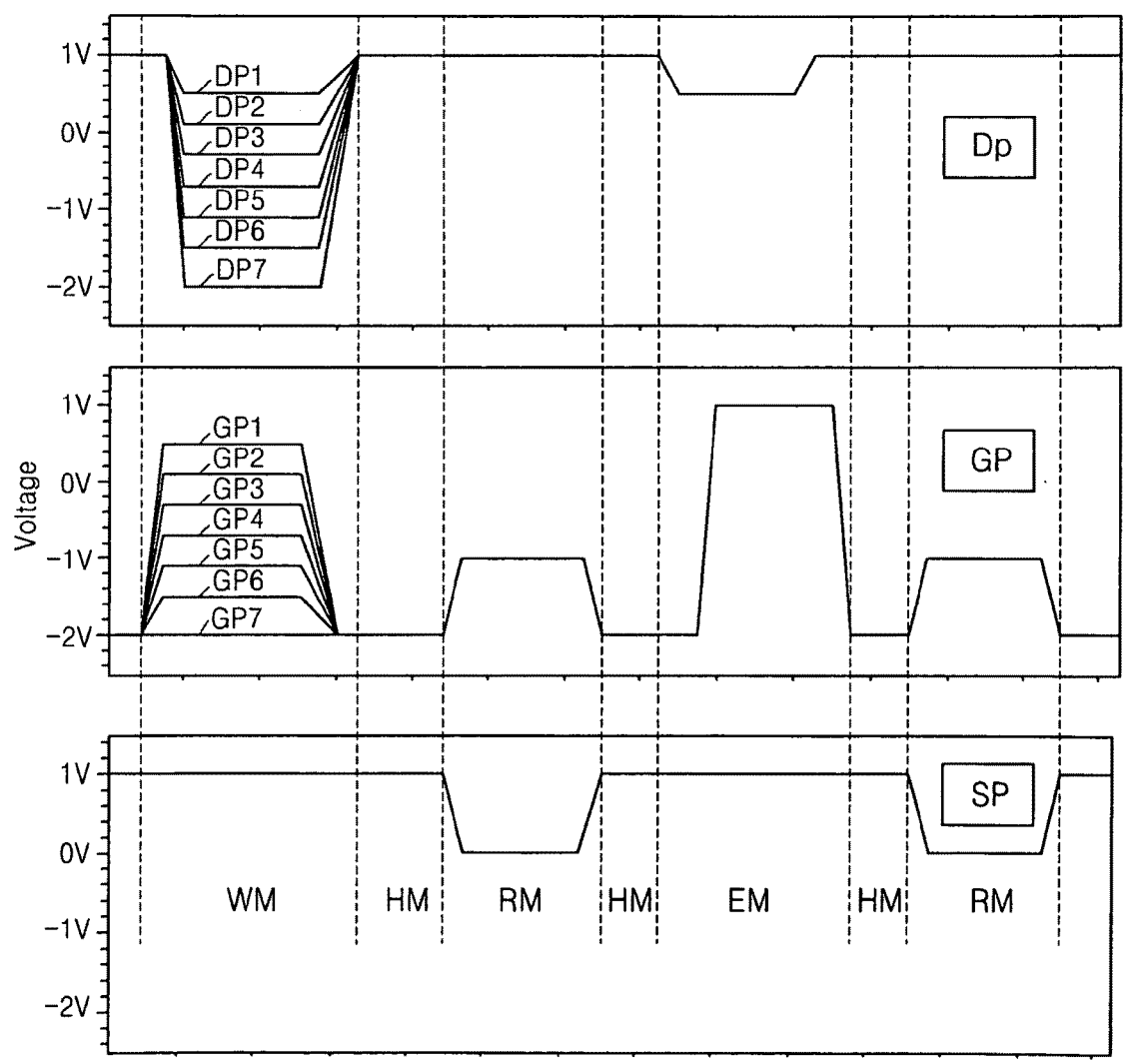

FIG. 12 illustrates voltage pulse signals supplied in a method of operating a semiconductor device according to an example embodiment. In the above embodiment of the method of operating a semiconductor device described above with reference to FIG. 7, data stored in the semiconductor device is determined by reducing the amount of carriers stored in a body region by removing an amount of the carriers from the body region (ERASE process). In contrast, in the current example embodiment, the state of data stored in the semiconductor device is determined by increasing the amount of carriers stored in the body region by storing an amount of carriers in the body region.

Referring to FIG. 12, in the current example embodiment, a third operation, e.g., a WRITE mode WM, may be performed in order to increase the amount of carriers stored in the body region.

Referring to FIGS. 1 and 12, in the WRITE mode WM, one of first to seventh drain voltage pulse signals DP1 to DP7 and a source voltage pulse signal SP may be supplied to the drain region 150 and the source region 140, and one of first to seventh gate voltage pulse signals GP1 to GP7 may be supplied to the gate electrode 130. Controlling the amount of carriers to be added to the body region 170 by adjusting the voltages of the first to seventh drain voltage pulse signals DP1 to DP7 and the first to seventh gate voltage pulse signals GP1 to GP7 in the WRITE mode WM is possible. When the first drain voltage pulse signal DP1 is supplied to the drain region 150, the first gate voltage signal GP1 may be supplied to the gate electrode 130. Similarly, when the seventh drain voltage pulse signal DP7 is supplied to the drain region 150, the seventh gate voltage signal GP7 may be supplied to the gate electrode 130. However, the inventive concept is not limited thereto, one of first to seventh drain voltage pulse signals DP1 to DP7 may be supplied to the drain region 150, and one of first to seventh gate voltage pulse signals GP1 to GP7 may be supplied to the gate electrode 130.

In the WRITE mode WM, the first gate voltage pulse signal GP1 has the highest voltage and the seventh gate voltage pulse signal GP7 has the lowest voltage from among the first to seventh gate voltage pulse signals GP1 to GP7. Also, the first drain voltage pulse signal DP1 has the highest voltage and the seventh drain voltage pulse signal DP7 has the lowest voltage from among the first to seventh drain voltage pulse signals DP1 to DP7. Thus, the amount of carriers that are to be added to the body region 170 in the WRITE mode WM may be controlled by adjusting the voltages of the gate voltage pulse signals GP1 to GP7 and the drain voltage pulse signals DP1 to DP7 in the WRITE mode WM. The lower the drain voltage is, the more carriers are generated in the body region 170 due to the voltage difference between the source region 140 and the drain region 150. And, the lower the gate voltage is, the more carriers are stored in the body region 170 since the more negative gate voltage hold the more carriers in the body region 170.

A semiconductor device has a data state corresponding to the amount of the carriers remaining in the body region 170 from among three or more data states. That is, the amount of carriers to be added to the body region 170 is changed by changing the voltages of the first to seventh drain voltage pulse signals DP1 to DP7 and the first to seventh gate voltage pulse signals GP1 to GP7 in the WRITE mode WM, and different data states may be expressed according to the amounts of the carriers remaining in the body region 170.

For example, if it is assumed that the semiconductor device has four data states, a first data state in which no carriers are stored in the body region 170 may correspond to data '00', a second data state in which an amount of carriers is added to the body region 170 may correspond to data '01', a third data state in which an amount of carriers is further added may correspond to data '10', and a fourth data state in which an amount of carriers is further added may correspond to data '11'.

In FIG. 12, the WRITE mode WM may be performed after performing the ERASE mode EM. That is, the amount of carriers to be added to the body region 170 in the WRITE mode WM may be changed after all carriers are removed from the body region 170 in the ERASE mode EM.

The WRITE mode WM of FIG. 12 may be performed in consecutive steps with performing the ERASE mode EM of FIG. 7. The WRITE mode WM of FIG. 12 may be performed in order to increase the amount of carriers remaining in the body region 170, and the ERASE mode EM of FIG. 7 may be performed in order to reduce the amount of carriers remaining in the body region 170. For example, it is possible to change data '10' written to the semiconductor device to data '01' by performing the ERASE mode EM of FIG. 7, and to change the data '01' to data '11' by performing the WRITE mode WM of FIG. 12.

Figure 13:
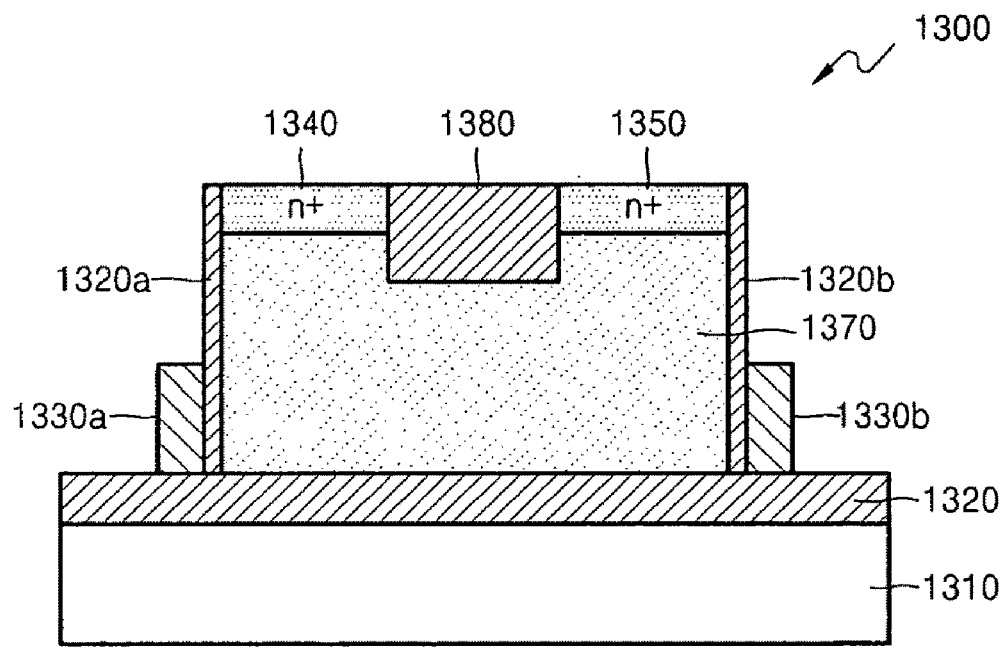

FIG. 13 is a cross-sectioned view of a 1-T DRAM 1300 that operates using a method of operating a semiconductor device according to an example embodiment. Referring to FIG. 13, the 1-T DRAM 1300 includes a semiconductor substrate 1310, an insulating layer 1320, first and second gate patterns 1330a and 1330b, a first impurities-doped region 1340, a second impurities-doped region 1350, and a body region 1370.

The body region 1370 is disposed on the insulating layer 1320. The first and second gate patterns 1330a and 1330b are formed on the insulating layer 1320 along both sides of the body region 1370, respectively. The first and second impurities-doped regions 1340 and 1350 are formed on the body region 1370, and may be respectively a drain region and a source region or vice versa.

The first and second gate patterns 1330a and 1330b may be disposed apart from the first and second impurities-doped regions 1340 and 1350 by a distance in the vertical direction, thereby preventing the first and second gate patterns 1330a and 1330b from overlapping with the first and second impurities-doped regions 1340 and 1350.

The first and second gate patterns 1330a and 1330b may extend in a direction perpendicular to a longer side of the body region 1370. For example, in FIG. 13, the first and second gate patterns 1330a and 1330b may extend in a direction crossing the longer side of the body region 1370.

The first and second impurities-doped regions 1340 and 1350 may protrude upward from the body region 1370 and be apart a distance from each other. An isolating oxide region 1380 may be arranged between the first and second impurities-doped regions 1340 and 1350.

The isolating oxide region 1380 is formed of a material containing an oxide but may be replaced with an insulating region formed of another insulating material. Also, oxide regions mentioned in this disclosure may be replaced with insulating regions formed of another insulating material.

The 1-T DRAM 1300 may further include first and second gate insulating regions 1320a and 1320b. The first gate insulating region 1320a is located between the first gate pattern 1330a and the body region 1370, and the second gate insulating region 1320b is located between the second gate pattern 1330b and the body region 1370. The first and second gate insulating regions 1320a and 1320b insulate the first gate pattern 1330a and the second gate insulating region 1320b from the body region 1370.

The 1-T DRAM 1300 may further include a buried oxide (BOX) region (not shown) formed on the semiconductor substrate 1310. The BOX region may be obtained by forming an oxide region on the semiconductor substrate 1310, wherein the oxide region is formed using a bulk substrate, or an insulating region in a silicon-on-insulator (SOI) substrate may be used as the BOX region.

Figure 14:
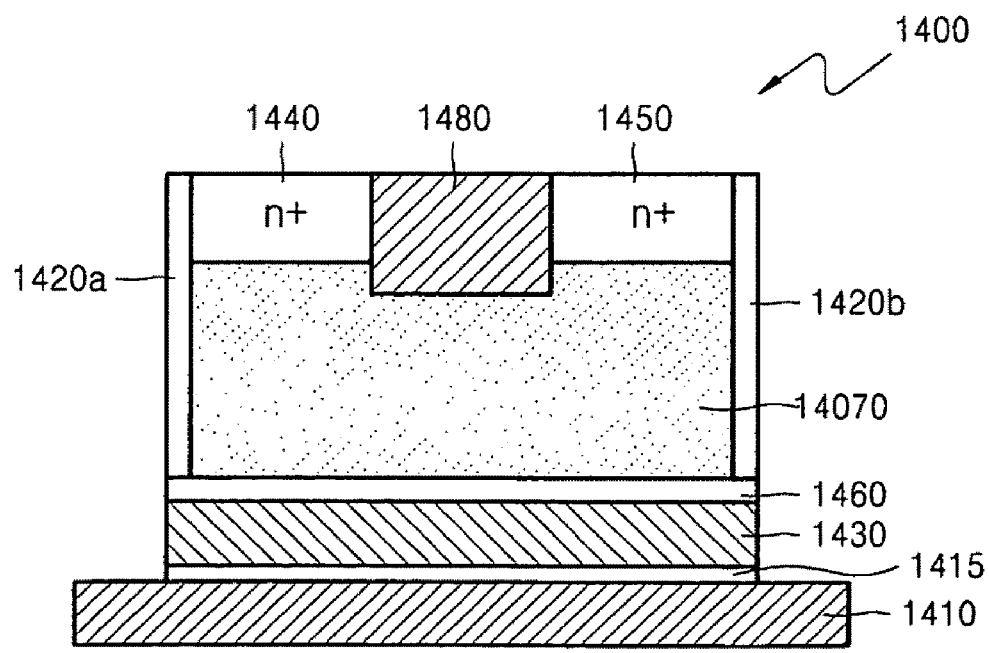

FIG. 14 is a cross-sectioned view of a 1-T DRAM 1400 that operates using a method of operating a semiconductor device according to an example embodiment. Referring to FIG. 14, the 1-T DRAM 1400 includes a semiconductor substrate 1410, a gate pattern 1430, a first impurities-doped region 1440, a second impurities-doped region 1450, an insulating layer 1460 and a body region 1470.

The gate pattern 1430 is disposed on the semiconductor substrate 1410. The body region 1470 is disposed on the gate pattern 1430. The first and second impurities-doped regions 1440 and 1450 are formed on the body region 1470. For example, the gate pattern 1430 is located below the body region 1470 and the first and second impurities-doped regions 1440 and 1450.

The body region 1470 may be a floating body region separated from the semiconductor substrate 1410. The body region 1470 and the semiconductor substrate 1410 may be formed of the same material.

The 1-T DRAM 1400 may further include a BOX region 1415 formed on the semiconductor substrate 1410. The 1-T DRAM 1400 may further include first and second insulating regions 1420a and 1420b. The first and second insulating regions 1420a and 1420b may be disposed along a side of the body region 1470. The first and second insulating regions 1420a and 1420b may insulate the body region 1470 from the other elements. Also, the first and second insulating regions 1420a and 1420b are disposed along both sides of the gate pattern 1430 and the body region 1470. The first and second insulating regions 1420a and 1420b insulate the gate pattern 1430 and the body region 1470 from the other elements.

While example embodiments have been particularly shown and described, it will be understood by one of ordinary skill in the art that variations in form and detail may be made therein without departing from the spirit and scope of the claims.

What is claimed is:

1. A method of operating a semiconductor device including a drain region, a source region, a floating body region, and a gate region, the method comprising:
   applying a first gate-drain voltage and a first gate-source voltage to generate and store carriers in the floating body region by using a first gate voltage pulse signal supplied to the gate region, a first drain voltage pulse signal supplied to the drain region, and a first source voltage pulse signal supplied to the source region the first gate-source voltage being greater than the first gate-drain voltage; and
   applying a second gate-drain voltage and a second gate-source voltage, using a variable second gate voltage pulse signal corresponding to an amount of carriers to be removed from the floating body region, wherein the semiconductor device includes a data state according to an amount of carriers remaining in the floating body region from among n data states, where n is a natural number equal to or greater than 3.

2. The method of claim 1, wherein, adjusting the second gate-drain voltage and the second gate-source voltage by varying the voltage of the second gate voltage pulse signal and holding a second drain voltage pulse signal and a second source voltage pulse signal constant controls the amount of the carriers removed from the floating body region.

3. The method of claim 2, wherein the higher the second gate-drain voltage, the more the amount of carriers removed from the floating body region.

4. The method of claim 2, wherein
   the enabled voltage of the second gate voltage pulse signal has a negative value, and a standby voltage of the second gate voltage pulse signal is more negative than the enabled voltage of the second gate voltage pulse signal, and
   the more negative the enable voltage of the second gate voltage pulse signal, the less the amount of holes removed from the floating body region.

5. The method of claim 4, wherein
   an enabled voltage of the second drain voltage pulse signal has a negative value, and
   a standby voltage of the second drain voltage pulse signal is less negative than the enabled voltage of the second drain voltage pulse signal.

6. The method of claim 1, wherein
   a drain-source voltage in an erase mode is lower than the drain-source voltage in a write mode, and
   the voltages applied to the drain and source regions in the erase mode are one of negative and positive, and are one of less negative and more positive than a voltage applied to the gate region in a standby state.

7. The method of claim 1, wherein
   a standby voltage of the first drain voltage pulse signal has a positive value,
   an enable voltage of the first drain voltage pulse signal is more positive than a standby voltage of the first drain voltage pulse signal, and
   the enable voltage of the first gate voltage pulse signal has a negative value, and a standby voltage of the first gate voltage pulse signal is more negative than the enable voltage of the first gate voltage pulse signal.

8. The method of claim 1, wherein
   the first drain voltage pulse signal is switched from a drain enable voltage to a drain standby voltage after the first gate voltage pulse signal is switched from a gate enable voltage to a gate standby voltage, and
   the second gate voltage pulse signal is switched from the gate enable voltage to the gate standby voltage after the second drain voltage pulse signal is switched from the drain enable voltage to the drain standby voltage.

9. The method of claim 1, further comprising:
   supplying the first gate voltage pulse signal and the second gate voltage pulse signal via a word line, and
   supplying the first drain voltage pulse signal and the second drain voltage pulse signal via a bit line.

10. The method of claim 1, further comprising:
    supplying a gate enable voltage of a third gate voltage pulse signal to the gate region; and
    adjusting a drain enable voltage of a third drain voltage pulse signal supplied to the drain region to increase the amount of the carriers stored in the floating body region.

11. The method of claim 10, further comprising:
    adjusting one of,
    the gate enable voltage and the drain enable voltage to increase the amount of the carriers stored in the floating body region, and
    the gate enable voltage to reduce the amount of the carriers remaining in the floating body region.

12. The method of claim 10, wherein switching the third drain voltage pulse signal from the drain enable voltage to the drain standby voltage after the third gate voltage pulse signal is switched from the gate enable voltage to the gate standby voltage.

13. The method of claim 10, further comprising:
supplying the third gate voltage pulse signal via a word line, and
supplying the third drain voltage pulse signal via a bit line.

14. The method of claim 10, further comprising:
removing the carriers from the floating body region.

15. The method of claim 1, further comprising:
measuring an amount of current that flows from the source region to the drain region.

16. The method of claim 15, wherein the amount of current defines the data state.

17. A method of operating a semiconductor device including a drain region, a source region, a floating body region, and a gate region, the method comprising:
applying a first gate-drain voltage and a first gate-source voltage to generate and store carriers in the floating body region by using a first gate voltage pulse signal supplied to the gate region, a first drain voltage pulse signal supplied to the drain region, and a first source voltage pulse signal supplied to the source region the first gate-source voltage being greater than the first gate-drain voltage;
supplying a second gate voltage pulse signal to the gate region, where the second gate voltage pulse signal has a first gate enable voltage corresponding to an amount of carriers to be removed from the floating body region; and
adjusting a second gate enable voltage of a third gate voltage pulse signal supplied to the gate region and a drain enable voltage of a third drain voltage pulse signal supplied to the drain region to increase the amount of the carriers stored in the floating body region, wherein the semiconductor device has a data state according to an amount of carriers remaining in the floating body region from among n data states, where n is a natural number equal to or greater than 3.

18. The method of claim 17, wherein adjusting the first gate enable voltage controls the amount of the carriers removed from the floating body region.

19. The method of claim 17, further comprising:
measuring an amount of current that flows from the source region to the drain region.

20. The method of claim 19, wherein the amount of current defines the data state.

* * * * *